(12) United States Patent  (10) Patent No.: US 8,263,451 B2
Su et al.  (45) Date of Patent: Sep. 11, 2012

(54) EPITAXY PROFILE ENGINEERING FOR FINFETS

(75) Inventors: Chien-Chang Su, Kaohsiung (TW); Tsz-Mei Kwok, Hsin-Chu (TW); Hsien-Hsin Lin, Hsin-Chu (TW); Hsueh-Chang Sung, Zhubei (TW); Yi-Fang Pai, Hsin-Chu (TW); Kuan-Yu Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 141 days.

(21) Appl. No.: 12/713,573

(22) Filed: Feb. 26, 2010

(65) Prior Publication Data

US 2011/0210404 A1 Sep. 1, 2011

(51) Int. Cl.
*H01L 21/336* (2006.01)
*H01L 21/8234* (2006.01)

(52) U.S. Cl. ........ 438/197; 438/149; 438/157; 438/176; 438/283; 438/479; 438/517; 438/770; 257/190; 257/255; 257/329; 257/350; 257/369; 257/390; 257/401; 257/413; 257/627; 257/E21.403; 257/E21.442; 257/E21.619; 257/E27.064; 257/E29.137; 257/E29.274

(58) Field of Classification Search .................. 257/190, 257/255, 329, 350, 369, 390, 401, 413, 627, 257/E21.001, E21.403, E21.442, E21.619, 257/E29.001, E29.137, E29.246, E29.274, 257/E27.064

See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 7,750,338 B2 | 7/2010 | Wang | |
| 2003/0227036 A1* | 12/2003 | Sugiyama et al. | 257/288 |
| 2005/0153490 A1 | 7/2005 | Yoon et al. | |
| 2006/0110887 A1* | 5/2006 | Huang | 438/296 |
| 2007/0063224 A1* | 3/2007 | Watanabe et al. | 257/204 |
| 2007/0075372 A1* | 4/2007 | Terashima et al. | 257/360 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |

(Continued)

OTHER PUBLICATIONS

Tan, K-M., et al., "Sub-30 nm Strained p-Channel Fin-Type Field-Effect Transistors with Condensed SIGe Source/Drain Stressors," Japanese Journal of Applied Physics, 2007, pp. 2058-2061, vol. 46, No. 4B.

*Primary Examiner* — Meiya Li
(74) *Attorney, Agent, or Firm* — Slater & Matsil, L.L.P.

(57) ABSTRACT

A method of forming an integrated circuit structure includes providing a wafer including a substrate and a semiconductor fin at a major surface of the substrate, and performing a deposition step to epitaxially grow an epitaxy layer on a top surface and sidewalls of the semiconductor fin, wherein the epitaxy layer includes a semiconductor material. An etch step is then performed to remove a portion of the epitaxy layer, with a remaining portion of the epitaxy layer remaining on the top surface and the sidewalls of the semiconductor fin.

20 Claims, 6 Drawing Sheets

U.S. PATENT DOCUMENTS

| | | |
|---|---|---|
| 2007/0241399 A1* | 10/2007 | Irisawa et al. ............... 257/347 |
| 2008/0003755 A1* | 1/2008 | Shah et al. .................. 438/300 |
| 2008/0290470 A1 | 11/2008 | King et al. |
| 2008/0296632 A1 | 12/2008 | Moroz et al. |
| 2009/0001415 A1* | 1/2009 | Lindert et al. ............... 257/190 |
| 2009/0026505 A1* | 1/2009 | Okano ......................... 257/255 |
| 2009/0181477 A1 | 7/2009 | King et al. |
| 2010/0224943 A1* | 9/2010 | Kawasaki ..................... 257/390 |
| 2011/0147840 A1* | 6/2011 | Cea et al. .................... 257/347 |

* cited by examiner

EPITAXY PROFILE ENGINEERING FOR FINFETS

TECHNICAL FIELD

This disclosure relates generally to semiconductor devices, and more particularly to structures and formation methods of semiconductor fins and fin field-effect transistors (FinFETs).

BACKGROUND

With the increasing down scaling of integrated circuits and increasingly higher requirements for integrated circuits, transistors need to have higher drive currents with increasingly smaller dimensions. Fin field-effect transistors (FinFETs) were thus developed.

Similar to planar transistors, source and drain silicides may be formed on the source and drain regions of FinFETs. However, since the fins of FinFETs are typically narrow, current crowding may occur. In addition, it is difficult to land contact plugs onto the source/drain portions of fins. Epitaxy semiconductor layers are thus formed on the fins to increase their volumes using epitaxy processes.

The epitaxial processes, however, suffer from drawbacks. FIG. 1 illustrates a cross-sectional view of a semiconductor structure including source/drain region 2 (which is part of the original fin) and epitaxy layer 4 epitaxially grown on source/drain region 2. In contrast to conventional planar devices, the volumes of source/drain regions 2 are not confined by shallow trench isolation (STI) regions 6. Since epitaxy layer 4 may have a growth rate smaller on (111) planes than on other planes, the outer surface of epitaxy layer 4 may not have a rectangular (or near-rectangular) profile as that of the original fin 2. Instead, epitaxy layer 4 may extend laterally and form facets 8. This may cause the excess reduction in the distance between epitaxy layers grown from neighboring fins. Accordingly, the merging window, in which the epitaxy layers growing from neighboring fins will not merge, is reduced. Further, even if the neighboring epitaxy layers 4 belong to a source/drain region of a same multi-fin FinFET, void 10 will be undesirably generated as a result of the merging of epitaxy layers 4 grown from neighboring fins 2, as shown in FIG. 2.

SUMMARY

In accordance with one aspect of the embodiment, a method of forming an integrated circuit structure includes providing a wafer including a substrate and a semiconductor fin at a major surface of the substrate, and performing a deposition step to epitaxially grow an epitaxy layer on a top surface and sidewalls of the semiconductor fin, wherein the epitaxy layer includes a semiconductor material. An etch step is then performed to remove a portion of the epitaxy layer, with a remaining portion of the epitaxy layer remaining on the top surface and the sidewalls of the semiconductor fin.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts.

A novel fin field-effect transistor (FinFET) embodiment and the method of forming the same are presented. The intermediate stages of manufacturing the embodiment are illustrated. The variations of the embodiment are discussed. Throughout the various views and illustrative embodiments, like reference numbers are used to designate like elements.

Figure 1:
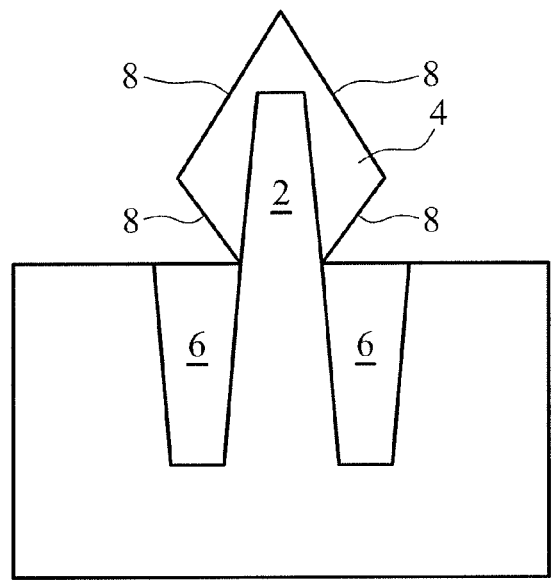
FIG. 1 illustrates a cross-sectional view of an epitaxy layer grown from a semiconductor fin.
Figure 2:
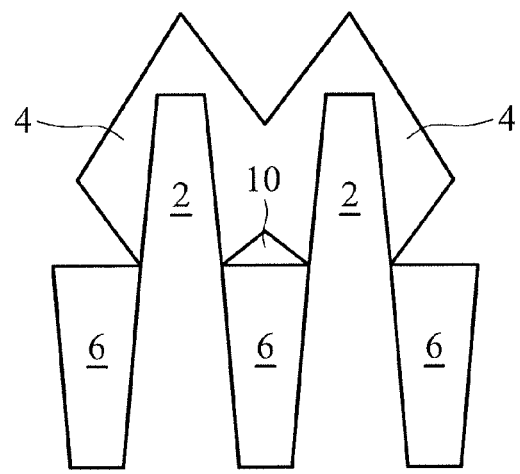
FIG. 2 illustrates the merging of the epitaxy layers grown from neighboring fins, wherein voids are generated when the epitaxy layers merge.
Figure 3:
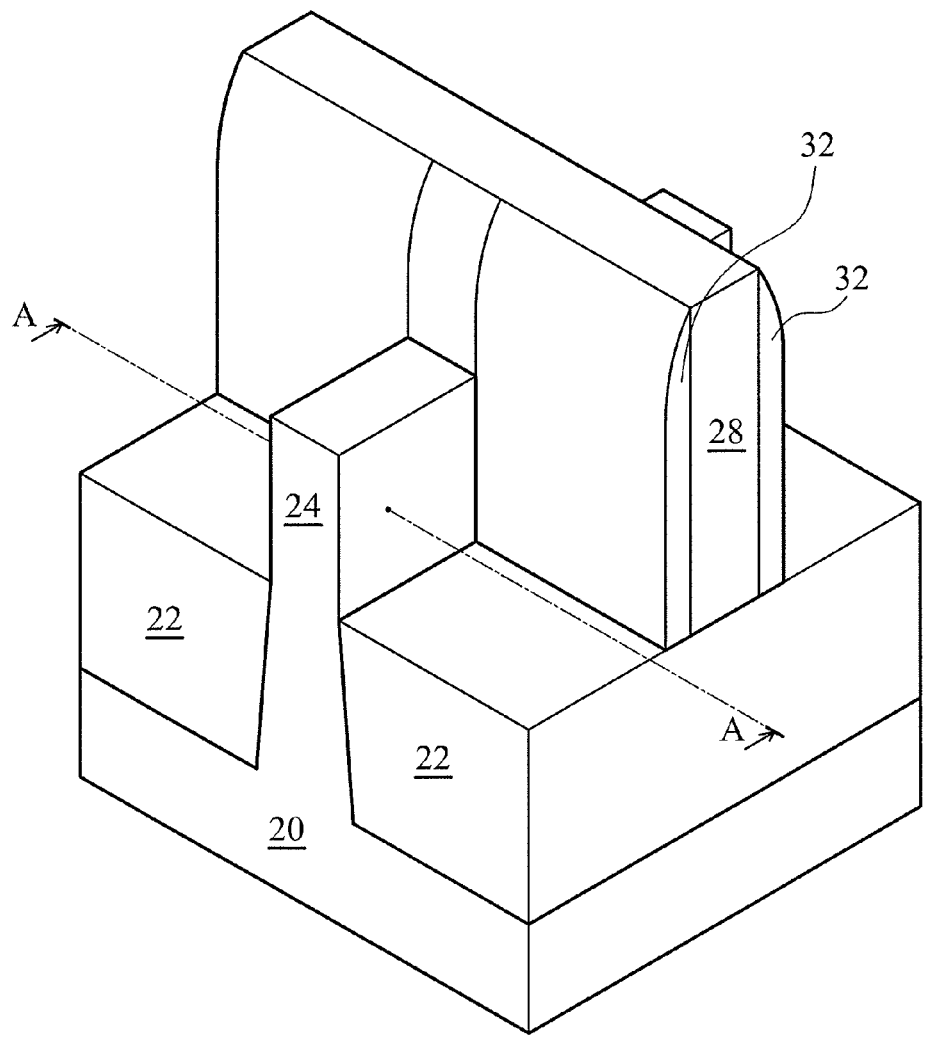
FIGS. 3 through 8 are a perspective view and cross-sectional views of intermediate stages in the manufacturing of a FinFET in accordance with an embodiment.

Referring to FIG. 3, an integrated circuit structure is formed. The integrated circuit structure includes substrate 20, which may be a bulk silicon substrate. Substrate 20 may be doped with a p-type or an n-type impurity. Isolation regions, such as shallow trench isolation (STI) regions 22 may be formed in substrate 20. Fin 24 is formed over top surfaces of STI regions 22. Fin 24 may be formed by removing top portions of STI regions 22, so that a portion of substrate 20 between neighboring STI regions 22 becomes a fin. Alternatively, fin 24 may be formed on top of substrate 20 by an epitaxial growth.

In an embodiment, substrate 20 has a surface orientation of (100), and fin 24 extends along the <110> direction. In other embodiments, substrate 20 may have other surface orientations such as (110), in which case fin 24 may extend in directions such as <100>. Gate dielectric 26 (not shown in FIG. 3, please refer to FIG. 4A), which may be formed of silicon oxide, high-k dielectric materials, or the like, is formed on the top surface and sidewalls of fin 24. Gate electrode 28 is formed on gate dielectric 26. Gate spacers 32 are formed on the sidewalls of gate electrode 28.

In the subsequent discussion, cross-sectional views are used to explain the concept of the embodiments. Unless specified otherwise, the cross-sectional views are obtained in vertical planes (referred to as source/drain planes hereinafter) crossing lines at the same position as line A-A in FIG. 3. It is noted that line A-A crosses the (would-be) source/drain region, but not gate electrode 28.

Figure 4A:
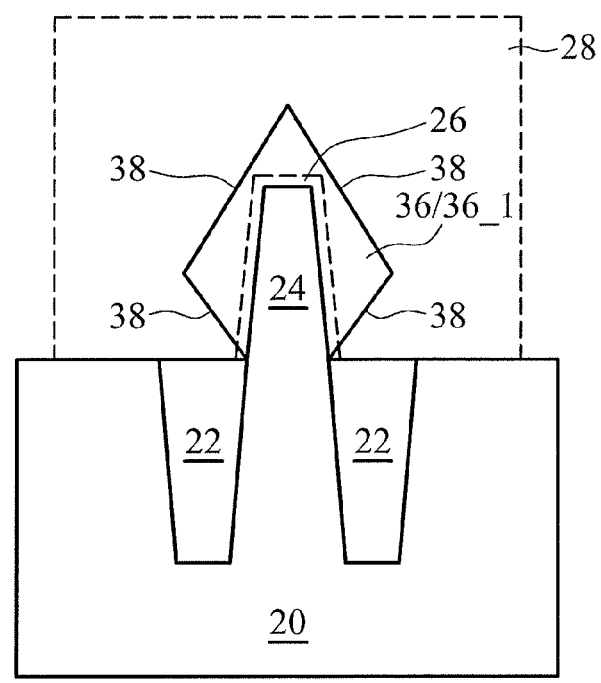

Next, as shown in FIG. 4A, epitaxy layer 36 is deposited, for example, epitaxially grown on the exposed portion of fin 24 by selective epitaxial growth (SEG). Epitaxy layer 36 (also referred to as epitaxy layer 36_1 hereinafter) may be formed of a semiconductor material same as, or a semiconductor material different from, that of fin 24. In an embodiment, epitaxy layer 36_1 is formed of substantially pure silicon. In alternative embodiments, epitaxy layer 36_1 may comprise silicon germanium (SiGe), silicon carbon (SiC), or the like. The formation methods of epitaxy layer 36_1 may include chemical vapor deposition (CVD), such as a reduced pressure CVD (RPCVD) or other applicable methods. Depending on the desirable composition of epitaxy layer 36_1, the precursors for the epitaxy may include Si-containing gases and Ge-containing gases, such as $SiH_4$ and $GeH_4$, and/or the like, and the partial pressures of the Si-containing gases and Ge-containing gases are adjusted to modify the atomic ratio of germanium to silicon. In an embodiment in which SiGe is desirable for forming epitaxy layer 36_1, the resulting epitaxy layer 36_1 includes greater than about 20 atomic percent germanium. The germanium percentage in epitaxy layer 36_1 may also be between about 20 percent and about 50 atomic percent.

FIG. 4A also illustrates gate dielectric 26 and gate electrode 28. Since gate dielectric 26 and gate electrode 28 are not in the source/drain plane, they are illustrated using dotted lines. For simplicity, in subsequent drawings, gate dielectric 26 and gate electrode 28 are not illustrated.

It is observed that due to different growth rates on different surface planes, facets may be formed. For example, the growth rate on surfaces having (111) surface orientations (referred to as (111) planes) is lower than that on other planes, such as (110) and (100) planes. Accordingly, facets 38 are formed as a result of the difference in the growth rates of different planes. If epitaxy layer 36_1 is grown freely, eventually, facts 38 will have the (111) surface orientations (in other word, on (111) planes). In the beginning of the epitaxial growth of epitaxy layer 36_1, facets 38 may not be fully established. However, with the proceeding of the epitaxial growth, due to the difference in growth rates, facets 38 are gradually formed.

Figure 4B:
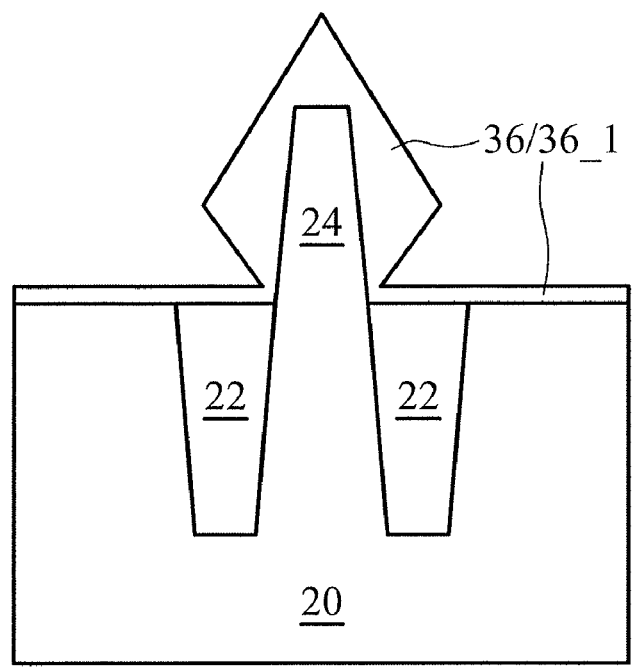

During the epitaxy process, etching gas, such as HCl gas, may be added (as an etching gas) into the process gas, so that epitaxy layer 36_1 is selectively grown on fin 24, but not on STI regions 22 and gate spacers 32 (not shown in FIG. 4A, please refer to FIG. 3). In alternative embodiments, no etching gas is added, or the amount of etching gas is small, so that there is a thin layer of epitaxy layer 36_1 formed on STI regions 22 and gate spacers 32, as shown in FIG. 4B. It is realized, however, that the portion of epitaxy layer 36_1 on STI regions 22 and gate spacers 32 may not have a crystalline structure.

Figure 5:
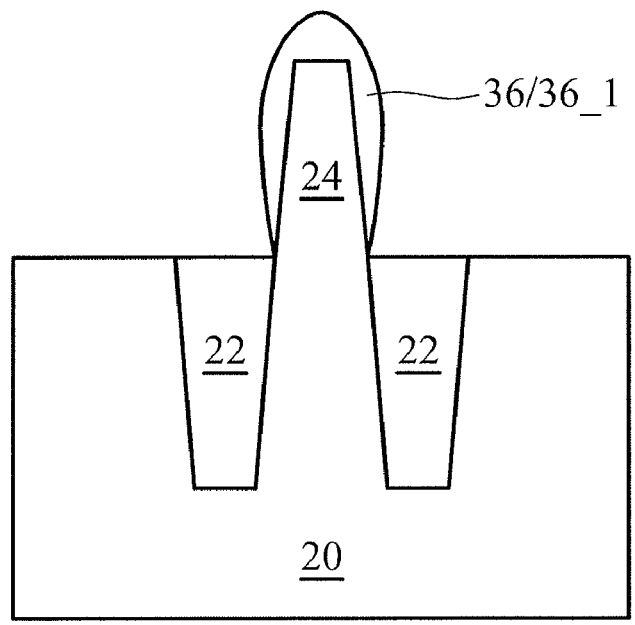

Referring to FIG. 5, after the formation of epitaxy layer 36_1, the epitaxial growth of epitaxy layer 36_1 is stopped, and an etch step is performed, for example, by introducing etching gases such as HCl into the same chamber as the deposition of epitaxy layer 36_1. In an embodiment, the epitaxial growth and the etch of epitaxy layer 36_1 are in-situ performed, that is, in a same process chamber with no vacuum break therebetween. The resulting structure is shown in FIG. 5. It is observed that during the etch step, the corners of epitaxy layer 36_1 are removed more than planar portions, and hence the surface profile of epitaxy layer 36_1 is rounded. In an exemplary embodiment, after the etch step, the resulting epitaxy layer 36_1 has an ellipse shape, with the outer surface of epitaxy layer 36_1 having a profile close to an egg shape. The etch step may include, for example, introducing either HCl or the combination of HCl and GeH$_4$ into the process chamber. The wafer temperature during the etch step may be greater than about 500° C. with both HCl and GeH$_4$ being introduced, or greater than about 700° C. with HCl, but no GeH$_4$, being introduced. During the etch step, plasma may or may not be activated.

Figure 6:
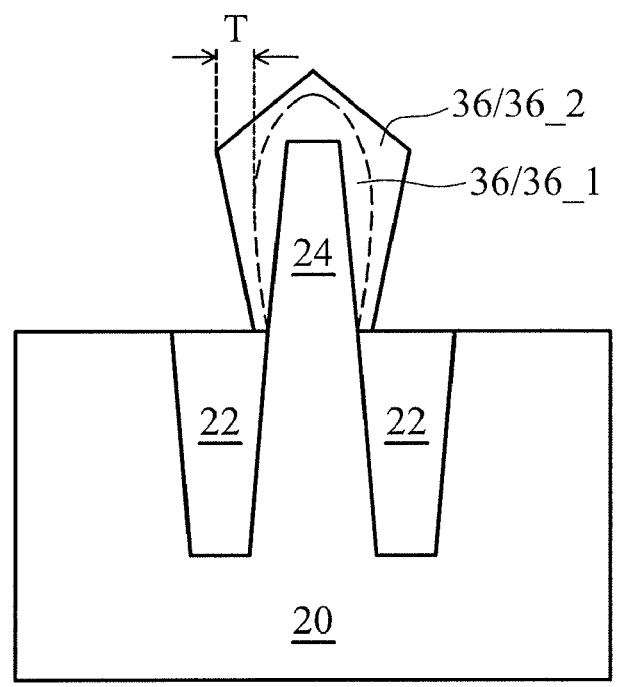
Figure 7:
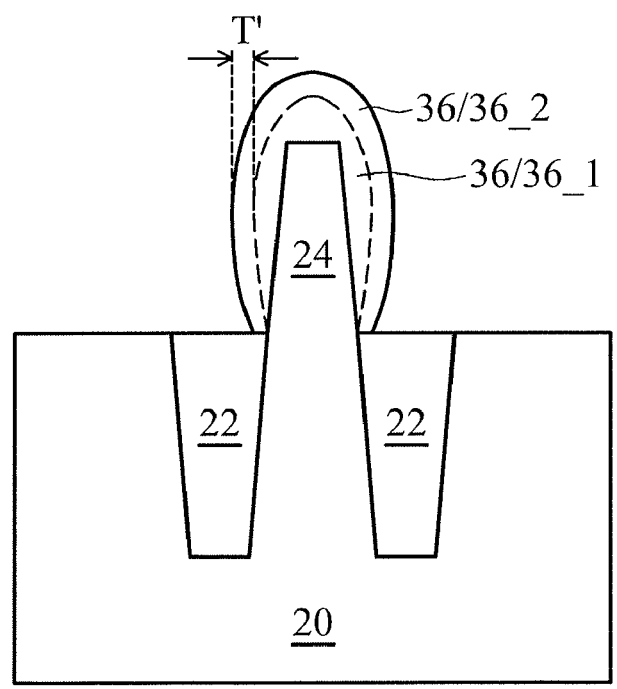

The deposition step and the etch step as discussed in the preceding paragraphs in combination are referred to as a deposition-etch cycle. In an embodiment, the formation of epitaxy layer 36 includes only one deposition-etch cycle. In alternative embodiments, after the first deposition-etch cycle, a second deposition step may be performed, which may further be followed by a second etch step, wherein the second deposition step and the second etch step are referred to as the second deposition-etch cycle. FIGS. 6 and 7 illustrate the structure resulted from the second deposition-etch cycle. In FIG. 6, epitaxy layer 36_2 is epitaxially grown on the remaining portion of epitaxy layer 36_1. Throughout the description, epitaxy layers 36_1 and 36_2 in combination are referred to as epitaxy layer 36. Epitaxy layer 36_2 may be formed of the same material as epitaxy layer 36_1, although they may also be formed of different semiconductor materials. Accordingly, the interface between epitaxy layers 36_1 and 36_2 is illustrated using a dashed line since it may not be visible. More deposition-etch cycles may be repeated to further increase the depth of epitaxy layer 36. The deposition-etch cycles may all be in-situ performed with no vacuum break therebetween. For each of the additional deposition-etch cycles, the thickness of epitaxy layer 36 is increased over the preceding deposition-etch cycle, and the profile of the resulting epitaxy layer 36 may be more conformal then if epitaxy layer 36 is formed by a single epitaxy step. Advantageously, by dividing one deposition-etch cycle into a plurality of deposition-etch cycles, the profile of epitaxy layer 36 may be more conformal.

With more portions of epitaxy layer 36 being etched, epitaxy layer 36 is more conformal. However, with a higher degree of etch back, the throughput is lower. In an embodiment, in the deposition step in each of the deposition-etch cycles, the thickness of the added portion of the epitaxy layer is denoted as T (refer to FIG. 6). After the etch step, the thickness of the added portion of epitaxy layer 36 is reduced to T' (refer to FIG. 7). The ratio of T'/T reflects the percentage of epitaxy layer 36 removed in the etch step. In an embodiment, ratio T'/T is greater than about 50 percent, and may be between about 50 percent and about 95 percent.

Figure 8:
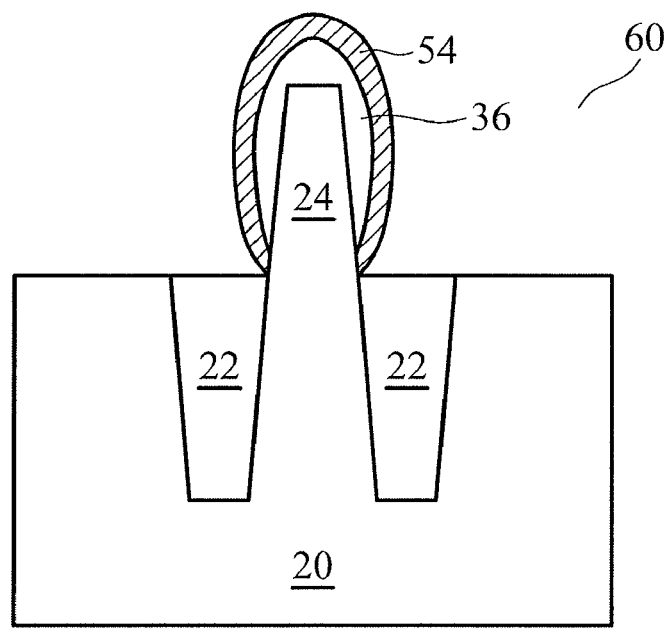

After the formation of epitaxy layer 36, a source/drain implantation is performed, so that epitaxy layer 36 becomes part of the source/drain region of the resulting FinFET 60. FIG. 8 illustrates the subsequent formation of silicide region (which may also be a germano-silicide region) 54. As is known in the art, silicide region 54 may be formed by blanket depositing a thin metal layer (not shown), such as nickel, platinum, palladium, vanadium, titanium, cobalt, tantalum, ytterbium, zirconium, and combinations thereof. The substrate is then heated, which causes silicon and germanium to react with the metal where contacted. After the reaction, a layer of metal silicide 54 is formed between the remaining portion of epitaxy layer 36 and the metal layer. The un-reacted metal layer is selectively removed through the use of an etchant that attacks metal but does not attack the germano-silicide.

Figure 9:
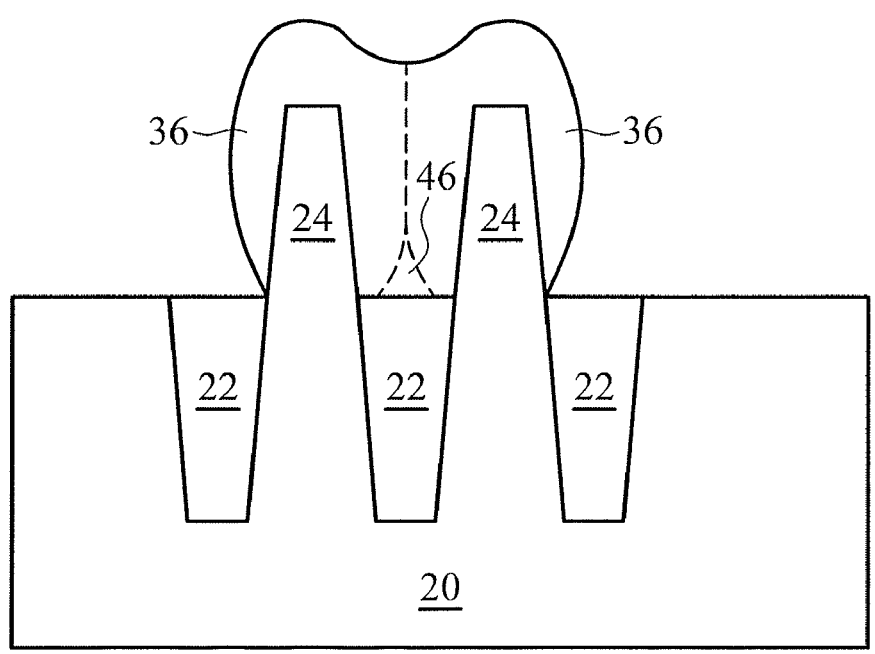
FIG. 9 illustrates the merging of two epitaxy layers growing from neighboring semiconductor fins.

FIG. 8 illustrates the formation of a single-fin FinFET, wherein epitaxy layer 36 grown from one fin 24 does not merge with the epitaxy layer grown from other fins. FIG. 9 illustrates that epitaxy layers 36 grown from neighboring fins 24 merge with each other to form a single epitaxy region. It is observed that due to the deposition-etch process, void 46 (if formed at all) caused by the merging of epitaxy layers 36 will be at least reduced, and possibly be eliminated. In addition, since defects are more likely to be generated from <111> surface planes, by etching back epitaxy layer 36, the sizes of the <111> surface planes are reduced, resulting in the decrease in the defect density.

Although the embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of forming an integrated circuit structure, the method comprising:
    providing a wafer comprising a substrate and a semiconductor fin at a major surface of the substrate;
    performing a first deposition step to epitaxially grow a first epitaxy layer on a top surface and sidewalls of the semiconductor fin, wherein the first epitaxy layer comprises a semiconductor material; and
    after the step of performing the first deposition step, performing a first etch step to remove a portion of the first epitaxy layer, with a remaining portion of the first epitaxy layer remaining on the top surface and the sidewalls of the semiconductor fin.

2. The method of claim 1 further comprising, before the step of performing the first deposition step, forming a gate dielectric and a gate electrode covering a portion of the semiconductor fin, wherein the epitaxy layer is grown from uncovered portions of the semiconductor fin.

3. The method of claim 1, wherein the first deposition step and the first etch step are performed with no vacuum break therebetween.

4. The method of claim 1 further comprising performing a second deposition step to epitaxially grow a second epitaxy layer over and contacting the remaining portion of the first epitaxy layer.

5. The method of claim 4 further comprising, after the second deposition step, performing a second etch step to reduce a thickness of the second epitaxy layer.

6. The method of claim 5, wherein after the second etch step, a remaining portion of the second epitaxy layer remains over the remaining portion of the epitaxy layer.

7. The method of claim 4, wherein the first epitaxy layer and the second epitaxy layer are formed of a same semiconductor material.

8. The method of claim 1, wherein the first deposition step is performed selectively with an etching gas introduced.

9. The method of claim 1, wherein the first etch step is performed using HCl and $GeH_4$ as process gases.

10. A method of forming an integrated circuit structure, the method comprising:
    providing a wafer comprising a substrate and a semiconductor fin at a major surface of the substrate;
    forming a gate dielectric and a gate electrode covering a first portion of the semiconductor fin, with a second portion of the semiconductor fin uncovered by the gate dielectric and the gate electrode; and
    performing a first deposition-etch cycle comprising:
        performing a first deposition step to form a first epitaxy semiconductor layer on the second portion of the semiconductor fin; and
        performing a first etch step to reduce a thickness of the first epitaxy semiconductor layer, wherein the first deposition step and the first etch step are in-situ performed with no vacuum break therebetween.

11. The method of claim 10 further comprising performing a second deposition-etch cycle comprising:
    performing a second deposition step to form a second epitaxy semiconductor layer on the first epitaxy semiconductor layer; and
    performing a second etch step to reduce a thickness of the second epitaxy semiconductor layer, wherein the second deposition step and the second etch step are in-situ performed with no vacuum break therebetween.

12. The method of claim 11, wherein after the second etch step, a remaining portion of the second epitaxy semiconductor layer remains over the first epitaxy semiconductor layer.

13. The method of claim 11, wherein the first epitaxy semiconductor layer and the second epitaxy semiconductor layer are formed of a same semiconductor material.

14. The method of claim 10, wherein the first deposition step is performed selectively with an etching gas introduced.

15. The method of claim 10, wherein the first etch step is performed using HCl and $GeH_4$ as process gases.

16. The method of claim 10, wherein after the first etch step, a remaining portion of the first epitaxy semiconductor layer has an ellipse surface profile.

17. A method of forming an integrated circuit structure, the method comprising:
    providing a wafer comprising:
        a semiconductor substrate;
        two shallow trench isolation (STI) regions in the semiconductor substrate; and
        a semiconductor fin over, and horizontally between, the two STI regions;
    forming a gate dielectric and a gate electrode covering a first portion of the semiconductor fin, with a second portion of the semiconductor fin uncovered by the gate dielectric and the gate electrode; and
    performing a plurality of deposition-etch cycles, each comprising:
        performing a deposition step to form an epitaxy layer over a top surface and sidewalls of the second portion of the semiconductor fin; and
        performing an etch step to remove a portion of the epitaxy layer, with a remaining portion of the epitaxy layer remaining on the top surface and sidewalls of the second portion of the semiconductor fin.

18. The method of claim 17, wherein the deposition step is selectively performed on the semiconductor fin, with substantially no epitaxy layer deposited on the two STI regions.

19. The method of claim 17, wherein the deposition step is performed non-selectively on the semiconductor fin and the two STI regions.

20. The method of claim 17, wherein the etch step is formed using process gases comprising HCl and $GeH_4$.

* * * * *